US006653231B2

(12) United States Patent
Okoroanyanwu et al.

(10) Patent No.: US 6,653,231 B2
(45) Date of Patent: Nov. 25, 2003

(54) PROCESS FOR REDUCING THE CRITICAL DIMENSIONS OF INTEGRATED CIRCUIT DEVICE FEATURES

(75) Inventors: Uzodinma Okoroanyanwu, Mountain View, CA (US); Chih-Yuh Yang, San Jose, CA (US); Jeffrey A. Shields, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 26 days.

(21) Appl. No.: 09/819,344

(22) Filed: Mar. 28, 2001

(65) Prior Publication Data

US 2002/0160628 A1 Oct. 31, 2002

(51) Int. Cl.$^7$ ............................................. H01L 21/44
(52) U.S. Cl. .................. 438/669; 438/713; 438/759; 438/788; 438/795
(58) Field of Search ................................ 438/669, 710, 438/707, 713, 788, 795, 759; 430/270.1, 5, 56, 130, 133, 135, 260

(56) References Cited

U.S. PATENT DOCUMENTS

| 3,997,367 A | 12/1976 | Yau ............................ 148/115 |
| 4,394,211 A | 7/1983 | Uchiyama et al. .......... 438/623 |
| 4,446,222 A * | 5/1984 | Kress ......................... 430/307 |
| 5,003,178 A | 3/1991 | Livesay ................... 250/492.3 |
| 5,468,595 A * | 11/1995 | Liversay ..................... 430/296 |
| 5,876,903 A | 3/1999 | Ng et al. .................... 430/313 |
| 5,962,195 A | 10/1999 | Yen et al. ................... 430/316 |
| 5,965,461 A | 10/1999 | Yang et al. ................. 438/717 |
| 5,994,225 A | 11/1999 | Liu et al. .................... 438/694 |
| 6,057,066 A * | 5/2000 | Hanawa ......................... 430/5 |
| 6,103,457 A | 8/2000 | Gabriel ....................... 430/318 |
| 6,107,172 A | 8/2000 | Yang et al. ................. 438/585 |
| 6,110,837 A | 8/2000 | Linliu et al. ................ 438/723 |
| 6,174,818 B1 | 1/2001 | Tao et al. .................... 438/733 |
| 6,197,687 B1 | 3/2001 | Buynoski .................... 438/671 |
| 6,200,903 B1 | 3/2001 | Oh et al. ..................... 438/705 |
| 6,232,048 B1 | 5/2001 | Buynoski et al. ............ 430/328 |
| 6,319,655 B1 | 11/2001 | Wong et al. ................ 430/311 |
| 6,358,670 B1 * | 3/2002 | Wong et al. ................ 430/296 |
| 6,395,447 B1 * | 5/2002 | Ishii et al. .................. 430/191 |
| 6,420,097 B1 * | 7/2002 | Pike et al. .................. 430/313 |

OTHER PUBLICATIONS

Chiong K.G. et al. "Resist Contrast Enhancement in High Resolution Electron Beam Lithography", Journal of Vacuum Science and Technology: Part B, American Institute of Physics, New York, US, vol. 7, No. 6.
Patent Abstracts of Japan, vol 1999, No. 09, Jul. 30, 1999 & JP 11 097328 A (Toshiba Corp), Apr. 9, 1999 abstract.
U.S. patent application Ser. No. 09/819,342, Shields et al., filed Mar. 28, 2001.
U.S. patent application Ser. No. 09/819,343, Gabriel et al., filed Mar. 28, 2001.
U.S. patent application Ser. No. 09/819,692, Okoranyanwu et al., filed Mar. 28, 2001.
U.S. patent application Ser. No. 09/819,552, Okoranyanwu et al., filed Mar. 28, 2001.

(List continued on next page.)

*Primary Examiner*—W. David Coleman
*Assistant Examiner*—Hsien-Ming Lee
(74) *Attorney, Agent, or Firm*—Foley & Lardner

(57) ABSTRACT

A process for forming sub-lithographic features in an integrated circuit is disclosed herein. A process for enhancing the etch trimmability and the etch stability of features patterned on a photoresist layer is also disclosed herein. The process includes curing a photoresist layer after patterning and development but before an etch process is performed thereon. By controlling the formation of the cured portions of the features patterned on the photoresist layer, the features can be trimmed to sub-lithographic critical dimensions without pattern deformation or occurrence of other failure mechanisms.

20 Claims, 6 Drawing Sheets

OTHER PUBLICATIONS

U.S. patent application Ser. No. 09/820,143, Okoranyanwu et al., filed Mar. 28, 2001.

Livesay, W. R., "*Large–area electron–beam source*," Journal of Vacuum Science & Technology B, vol. 11, No. 6, Nov./Dec. 1993, pp. 2304–2308, American Vacuum Society.

Yang, J. J. et al. "*Electron Beam Processing for Spin–on Polymers and its Applications to Back–End–of–Line (BEOL) Integration*," Materials Research Society Symposium Proceedings, vol. 511, 1998, pp. 49–55, Materials Research Society.

Ross et al. "*Plasma Etch Characteristics of Electron Beam Processed Photoresist*," The Society of Photo–Optical Instrumentation Engineers, vol. 2438, 1995, pp. 803–816, SPIE– The International Society for Optical Engineering.

Grün, Von A. E., "*Lumineszenz–photometrische Messungen der Energieabsorption im Strahlungsfeld von Elektronenquellen Eindimensionaler Fall in Luft,* " Zeitschrift für Naturforschung, vol. 12a, 1957, pp. 89–95, Publisher: Zeitschrift für Naturforschung; full English Translation attached (11 pgs.).

U.S. patent application Ser. No. 09/819,342, Shields et al., filed Mar. 28, 2001.

U.S. patent application Ser. No. 09/819,343, Gabriel et al., filed Mar. 28, 2001.

U.S. patent application Ser. No. 09/819,552, Gabriel et al., filed Mar. 28, 2001.

U.S. patent application Ser. No. 09/819,692, Okoranyanwu et al., filed Mar. 28, 2001.

U.S. patent application Ser. No. 09/820,143, Okoroanyanwu et al., filed Mar. 28, 2001.

Livesay, W. R., "*Large–area electron–beam source*," Journal of Vacuum Science & Technology B, vol. 11, No. 6, Nov./Dec. 1993, pp. 2304–2308, American Vacuum Society.

Yang, J. J. et al, "*Electron Beam Processing for Spin–on Polymers and its Application to Back–End–of–Line (BEOL) Integration*," Materials Research Society Symposium Proceedings, vol. 511, 1998, pp. 49–55, Materials Research Society.

Ross et al, "*Plasma Etch Characteristics of Electron Beam Processed Photoresist*," The Society of Photo–Optical Instrumentation Engineers, vol. 2438, 1995, pp. 803–816, SPIE–The International Society for Optical Engineering.

Grün, Von A. E., "*Lumineszenz–photometrische Messungen der Energieabsorption im Strahlungsfeld von Elektronenquellen Eindimensionaler Fall in Luft,*" Zeitschrift für Naturforschung, vol. 12a, 1957, pp. 89–95, Publisher: Zeitschrift für Naturforschung; full English Translation attached (11 pgs.).

\* cited by examiner

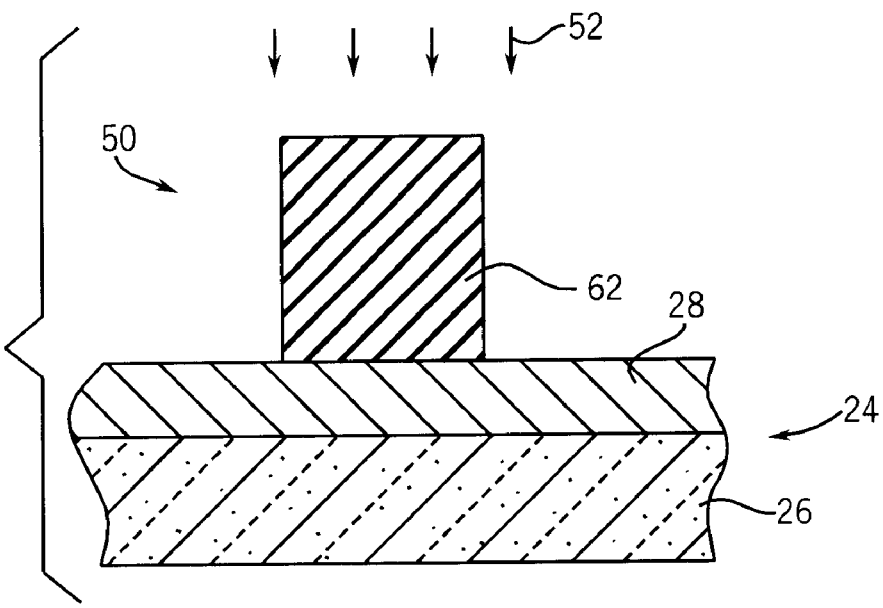
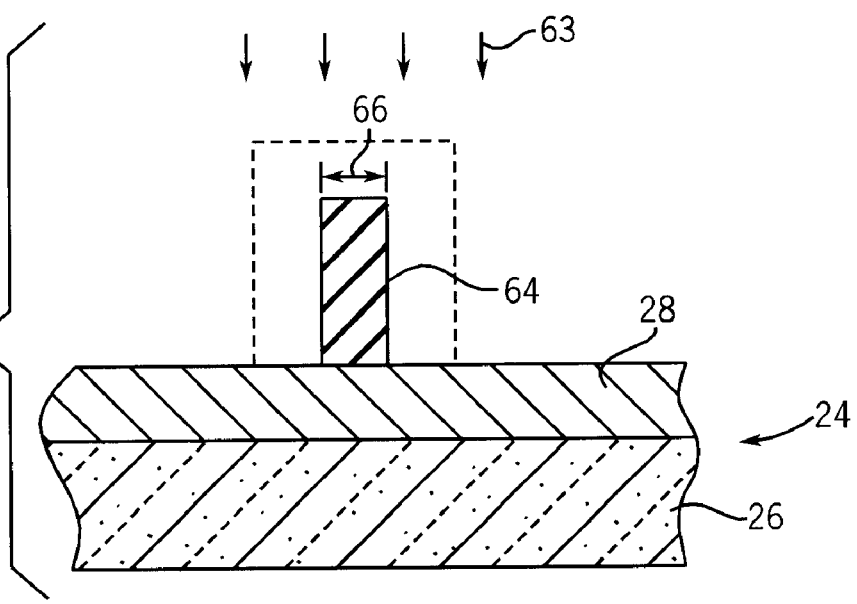

PROCESS FOR REDUCING THE CRITICAL DIMENSIONS OF INTEGRATED CIRCUIT DEVICE FEATURES

CROSS REFERENCE TO RELATED APPLICATIONS

The present application is related to U.S. application Ser. No. 09/816,692 by Okoroanyanwu et al., entitled "Process for Preventing Deformation of Patterned Photoresist Features;" U.S. application Ser. No. 09/820,143 by Okoroanyanwu et al., entitled "Improving SEM Inspection and Analysis of Patterned Photoresist Features;" U.S. application Ser. No. 09/819,342 by Okoroanyanwu et al., entitled "Process for Forming Sub-lithographic Photoresist Features by Modification of the Photoresist Surface;" U.S. application Ser. No. 09/819,343 by Gabriel et al., entitled "Selective Photoresist Hardening to Facilitate Lateral Trimming;" and U.S. application Ser. No. 09/819,552 by Gabriel et al., entitled "Process for Improving the Etch Stability of Ultra-Thin Photoresist," all filed on an even date herewith and assigned to the Assignee of the present application.

FIELD OF THE INVENTION

The present invention relates generally to integrated circuit (IC) fabrication. More particularly, the present invention relates to fabrication of IC features having reduced critical dimensions than is possible with conventional lithography and resolution enhancement techniques.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration requires continued shrinking of circuit dimensions and device features. The ability to reduce the size of structures, such as, gate lengths in field-effect transistors and the width of conductive lines, is driven by the performance of lithographic tools (e.g., wavelength of the exposure sources), resolution enhancement techniques (e.g., phase shifting masks, off-axis illumination, etc.), and photoresist materials (collectively referred to as lithographic techniques).

However, currently available lithographic techniques lack the resolution to print desirably small IC device features. Thus, various non-lithographic techniques are also employed to shrink or reduce feature dimensions after lithographic printing. One such non-lithographic technique is a resist trimming process that reduces or "trims" features patterned on a photoresist layer of a semiconductor wafer before such features are transferred onto the underlying layer(s) of the semiconductor wafer. The resist trimming process utilizes a plasma etch to remove some of the patterned photoresist material such that the critical dimensions of the patterned features are reduced.

Different types of photoresist materials exhibit different trimming performances. For example, photoresist materials designed for 193 nm lithography, e.g., photoresist materials comprising acrylate-based polymers and/or alicyclic-based polymers, have poor trimming performance in comparison with 248 nm photoresist materials, e.g., photoresist materials comprising phenolic polymers. Typical failure mechanisms during the resist trimming process for features patterned on 193 nm photoresist materials include pattern collapse, pattern bending, pattern breakage, general mechanical deformation, and/or uncontrollable photoresist erosion rates. Other photoresist materials also exhibit such failure mechanisms depending on the operating conditions of the resist trimming process (e.g., prolonged trimming time) and/or the original dimensions of the lithographically printed features on the photoresist materials.

To mitigate some of these failure mechanisms, a thinner layer of photoresist material may be disposed on the wafer for lithographic printing or pattern transfer of features from a mask or reticle. However, the initial reduction in photoresist thickness allows for less critical dimension reduction with the resist trimming process due to photoresist consumption concerns. Since the resist trimming process trims the exposed surfaces of the patterned features in both the vertical and horizontal directions (i.e., simultaneously reduces the height and width of the patterned features), by the time a desirable trimmed width has been achieved, there may not be enough height or vertical thickness remaining for the trimmed features to survive subsequent processes (e.g., an etch process for polysilicon gate formation).

Thus, there is a need for a process for enhancing the etch trimmability and etch stability of patterned photoresist features. There is a further need for a process for forming IC features having smaller critical dimensions than is possible with conventional lithographic and non-lithographic techniques. There is still a further need for a process for preventing pattern collapse, pattern bending, pattern breakage, and/or general mechanical deformation of patterned resist features during etch processing.

BRIEF SUMMARY OF THE INVENTION

One exemplary embodiment relates to a method for achieving a sub-lithographic critical dimension in an integrated circuit device feature. The integrated circuit device feature is formed on a semiconductor wafer using a feature patterned on a photoresist layer. The method includes curing the feature patterned on the photoresist layer with an electron beam. The method further includes trimming the cured feature to form a trimmed feature. The sub-lithographic critical dimension of the trimmed feature is dependent on a dose of the electron beam.

Another exemplary embodiment relates to a feature patterned on a photoresist layer having enhanced etch stability and trimmability in an etch process. The feature includes a top region. The feature is formed by the process including irradiating the feature patterned on a photoresist layer with an electron beam before the etch process. At least the top region of the feature is cross-linked to the point of complete decomposition to form a cross-linked top region.

Still another exemplary embodiment relates an integrated circuit fabrication process. The process includes curing a patterned photoresist layer with an electron beam, and trimming the cured photoresist layer with a plasma etch. The process further includes transferring a pattern of the trimmed photoresist layer to the substrate. The patterned photoresist layer is disposed over a substrate. A critical dimension of the transferred pattern on the substrate has a sub-lithographic dimension and is a function of a dose of the electron beam in the curing step.

BRIEF DESCRIPTION OF THE DRAWINGS

The exemplary embodiments will become more fully understood from the following detailed description, taken in conjunction with the accompanying drawings, wherein like reference numerals denote like elements, in which:

FIG. 4C is a cross-section view of the wafer illustrated in FIG. 3, showing another alternative embodiment of the flood electron beam exposure step;

FIG. 5 is a cross-section view of the wafer illustrated in each of FIGS. 4A–4C, showing a resist trimming step;

DETAILED DESCRIPTION OF THE EXEMPLARY EMBODIMENTS

Figure 1:
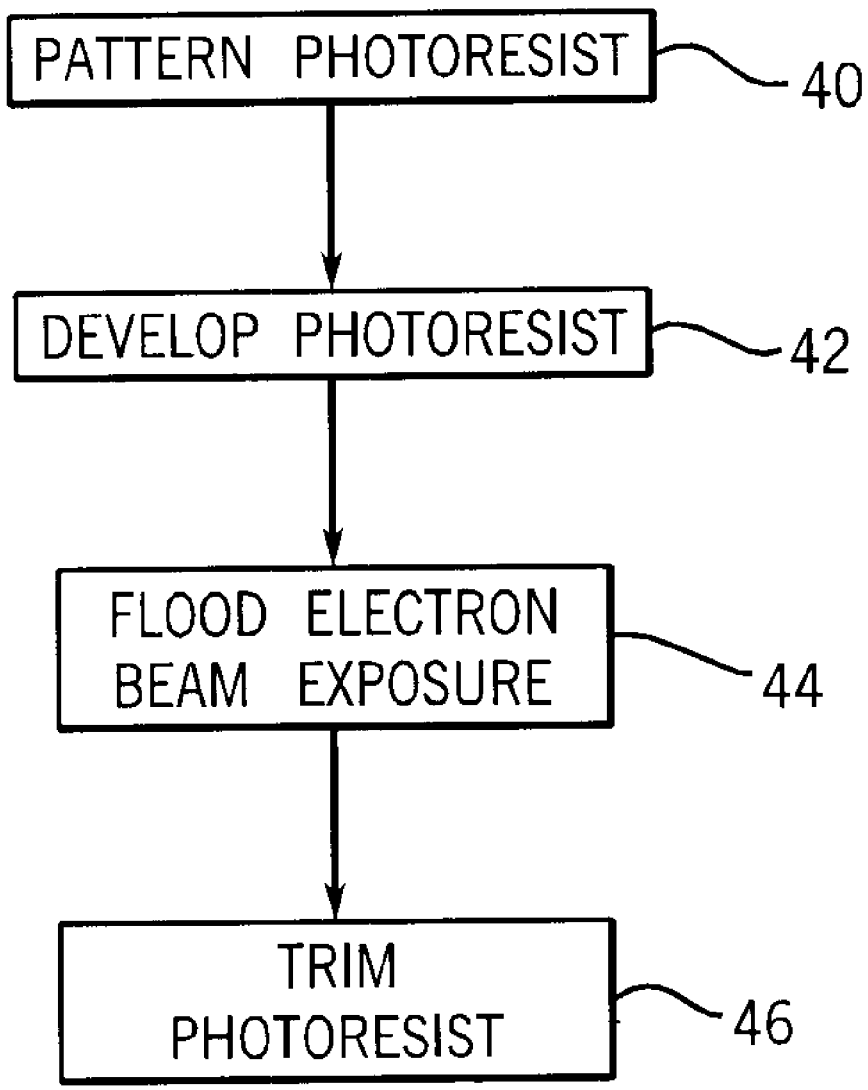
FIG. 1 is a flow diagram showing a process for enhancing the etch trimmability and the etch stability of patterned features on a photoresist layer of a semiconductor wafer in accordance with an exemplary embodiment.

In one embodiment of the present invention, an advantageous process for enhancing the etch trimmability and the etch stability of features patterned on a photoresist layer during an integrated circuit (IC) fabrication is provided. An exemplary embodiment of the present invention will be described with respect to a flow diagram shown in FIG. 1. The flow diagram includes a patterning step 40, a developing step 42, a flood electron beam exposure step 44, and a resist trimming step 46.

Figure 2:
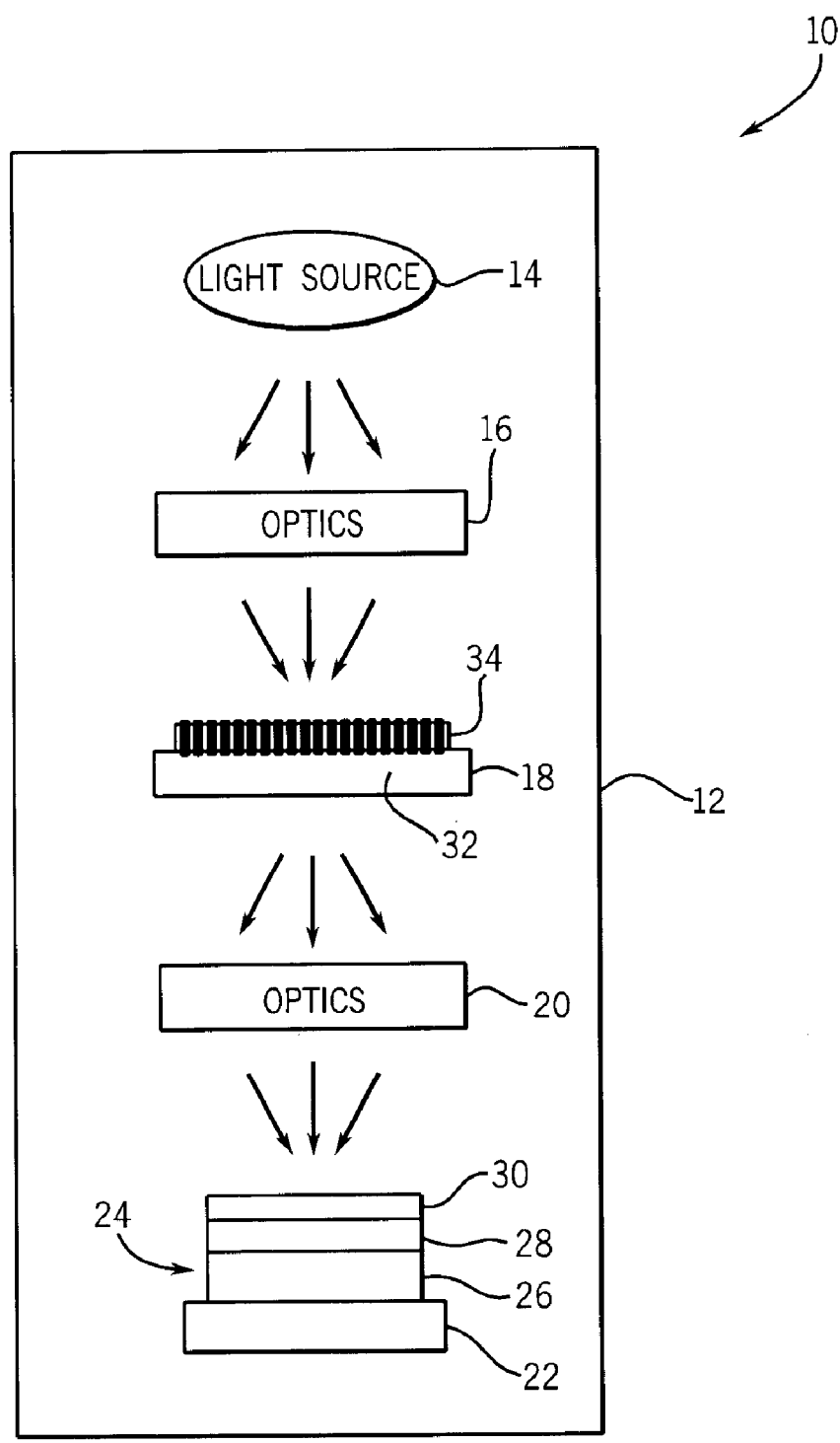
FIG. 2 is a general schematic block diagram of a lithographic system for patterning the wafer in accordance with an exemplary embodiment.

Patterning step 40 is carried out using a lithography system 10, as shown in FIG. 2. Lithographic system 10 includes a chamber 12, a light source 14, a condenser lens assembly 16, a mask or a reticle 18, an objective lens assembly 20, and a stage 22. Lithographic system 10 is configured to transfer a pattern or image provided on mask or reticle 18 to a wafer 24 positioned in lithography system 10. Lithographic system 10 may be a lithographic camera, stepper, or scanner unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea.

Wafer 24 includes a substrate 26, a layer 28, and a photoresist layer 30. Photoresist layer 30 is disposed over layer 28, and layer 28 is disposed over substrate 26. Wafer 24 can be an entire integrated circuit (IC) wafer or a part of an IC wafer. Wafer 24 can be a part of an IC, such as, a memory, a processing unit, an input/output device, etc. Substrate 26 can be a semiconductor substrate, such as, silicon, gallium arsenide, germanium, or other substrate material. Substrate 26 can include one or more layers of material and/or features, such as lines, interconnects, vias, doped regions, etc., and can further include devices, such as, transistors, microactuators, microsensors, capacitors, resistors, diodes, etc.

Layer 28 can be an insulative layer, a conductive layer, a barrier layer, or other layer of material to be etched, doped, or layered. In one embodiment, layer 28 can comprise one or more layers of materials, such as, a polysilicon stack comprised of a plurality of alternating layers of titanium silicide, tungsten silicide, cobalt silicide materials, etc. In another embodiment, layer 28 is a hard mask layer, such as, a silicon nitride layer or a metal layer. The hard mask layer can serve as a patterned layer for processing substrate 26 or for processing a layer upon substrate 26. In yet another embodiment, layer 28 is an anti-reflective coating (ARC). Substrate 26 and layer 28 are not described in a limiting fashion, and can each comprise a conductive, semiconductive, or insulative material.

Photoresist layer 30 can comprise a variety of photoresist chemicals suitable for lithographic applications. Photoresist layer 30 is selected to have photochemical reactions in response to electromagnetic radiation emitted from light source 14. Materials comprising photoresist layer 30 can include, among others, a matrix material or resin, a sensitizer or inhibitor, and a solvent. Photoresist layer 30 is preferably a chemically amplified, positive or negative tone, organic-based photoresist. Photoresist layer 30 may be, but is not limited to, an acrylate-based polymer, an alicyclic-based polymer, or a phenolic-based polymer. For example, photoresist layer 30 may comprise PAR700 photoresist manufactured by Sumitomo Chemical Company. Photoresist layer 30 is deposited, for example, by spin-coating over layer 28. Photoresist layer 30 is provided at a thickness of less than 1.0 μm. Photoresist layer 30 is provided at a thickness of approximately 3,000–10,000 Å for 248 nm lithography, and a thickness of approximately 200–400 nm for 193 nm lithography.

Chamber 12 of lithographic system 10 can be a vacuum or low pressure chamber for use in ultraviolet (UV), vacuum ultraviolet (VUV), deep ultraviolet (DUV), extreme ultraviolet (EUV), x-ray, or other types of lithography. Chamber 12 can contain any of numerous types of atmospheres, such as, nitrogen, etc. Alternatively, chamber 12 can be configured to provide a variety of other patterning scheme.

Light source 14 provides light or electromagnetic radiation through condenser lens assembly 16, mask or reticle 18, and objective lens assembly 20 to photoresist layer 30. Light source 14 is an excimer laser, in one embodiment, having a wavelength of 365 nm, 248 nm, 193 nm, 157 nm, or 126 nm, or a soft x-ray source having a wavelength at 13.4 nm. Alternatively, light source 14 may be a variety of other light sources capable of emitting radiation having a wavelength in the ultraviolet (UV), vacuum ultraviolet (VUV), deep ultraviolet (DUV), extreme ultraviolet (EUV), x-ray or other wavelength range.

Assemblies 16 and 20 include lenses, mirrors, collimators, beam splitters, and/or other optical components to suitably focus and direct a pattern of radiation (i.e., radiation from light source 14 as modified by a pattern or image provided on mask or reticle 18) onto photoresist layer 30. Stage 22 supports wafer 24 and can move wafer 24 relative to assembly 20.

Mask or reticle 18 is a binary mask in one embodiment. Mask or reticle 18 includes a translucent substrate 32 (e.g., glass or quartz) and an opaque or absorbing layer 34 (e.g., chromium or chromium oxide) thereof. Absorbing layer 34 provides a pattern or image associated with a desired circuit pattern, features, or devices to be projected onto photoresist layer 30. Alternatively, mask or reticle 18 may be an attenuating phase shift mask, an alternating phase shift mask, or other type of mask or reticle.

Figure 3:
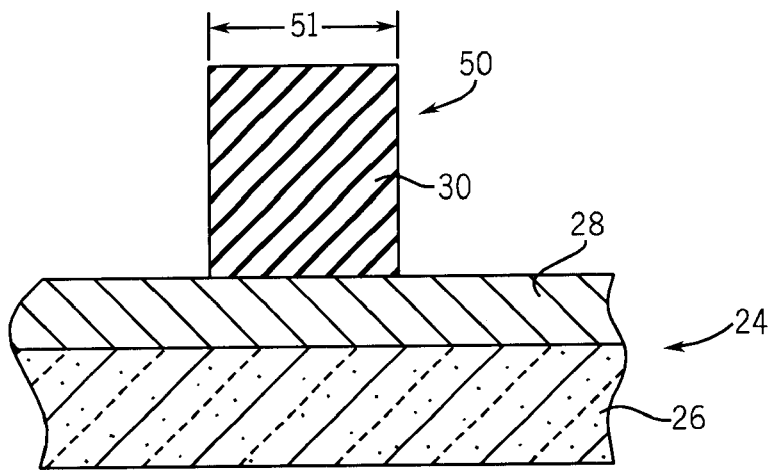
FIG. 3 is a cross-sectional view of the wafer illustrated in FIG. 2, showing a developing step.

Utilizing lithographic system 10, the pattern or image on mask or reticle 18 is projected onto and patterned on photoresist layer 30 of wafer 24. Next, in developing step 42, wafer 24 is exposed to a developer, as is well-known in the art, to develop the pattern on photoresist layer 30. Referring to FIG. 3, a cross-sectional view of a portion of wafer 24 after developing step 42 is shown. The developed pattern includes a feature 50. Feature 50 has a width or lateral dimension 51.

After photoresist layer 30 has been developed but before features thereon are transferred onto any of the underlying layers, such as layer 28, flood electron beam exposure step 44 is performed. Wafer 24 may be removed from chamber 12 and placed within a different chamber and/or a different environment which provides electron beam tools. Alternatively, chamber 12 may be configured to include additional chambers and/or tools suitable to perform step 44.

Figure 4A:
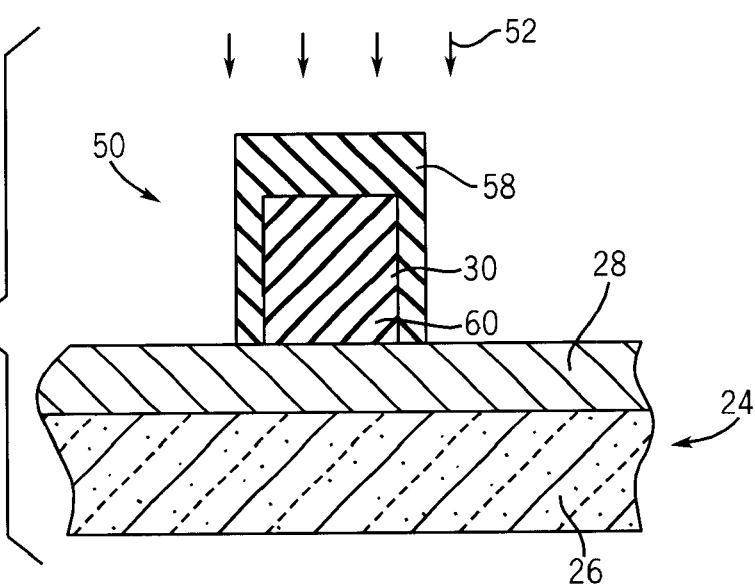
FIG. 4A is a cross-sectional view of the wafer illustrated in FIG. 3, showing one embodiment of a flood electron beam exposure step.

In FIG. 4A, there is shown wafer 24 undergoing flood electron beam exposure step 44. A flood electron beam 52 impinges on the exposed surfaces of layer 30 and chemically transforms or modifies such exposed surfaces to a certain depth. For feature 50, a top surface or region and sidewalls are transformed into a shell 58. Upon completion of step 44, feature 50 comprises an uncured region 60 and shell 58, uncured region 60 being encapsulated from underneath by layer 28 and on all other sides or faces by shell 58. Preferably, the vertical thickness of the top region of shell 58 is greater than the horizontal thickness of each of the sidewalls of shell 58.

Figure 4B:
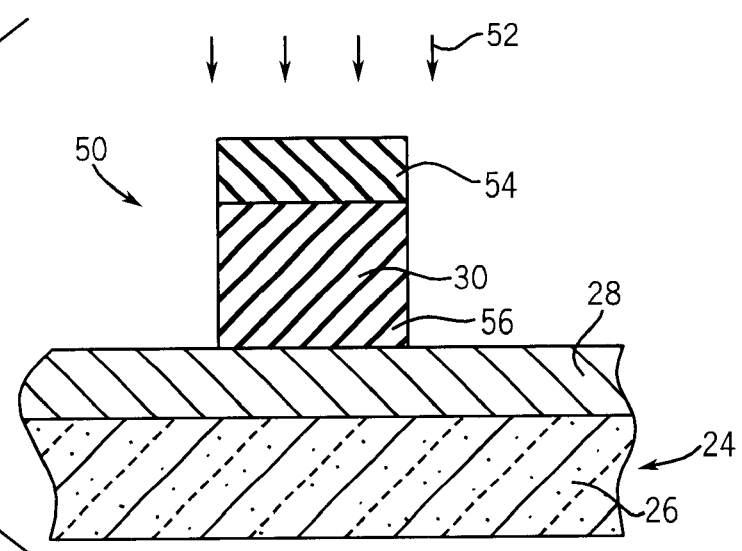
FIG. 4B is a cross-section view of the wafer illustrated in FIG. 3, showing an alternative embodiment of the flood electron beam exposure step.

In alternative embodiments, electron beam 52 may transform or cure other regions or proportions of feature 50 in step 44. As shown in FIG. 4B, feature 50 comprises a top cured region 54 and an uncured region 56. Top cured region 54 is the chemically modified region of feature 50 due to penetration by electron beam 52. In this embodiment, the parameters of electron beam 52, to be described in greater detail hereinafter, have been selected such that electron beam 52 does not penetrate deeper than the bottom of top cured region 54. An uncured region 56 is the unchanged region of feature 50. In FIG. 4C, the parameters of electron beam 52 have been selected such that all of the material comprising feature 50 is chemically modified into a cured region 62.

Electron beam 52 is preferably emitted from an extended area electron source (not shown) and is a uniform collimated beam that is flood exposed over the entire wafer 24 at a normal angle of evidence. The extended area electron source is of the cold cathode type and generates electron beam 52 from the energetic impact of ions against a suitable metal. An example of an extended area electron source suitable to generate electron beam 52 is manufactured by Electron Vision Corporation of San Diego, Calif.

The electron beam flood exposure conditions or parameters (e.g., beam current, dose, and accelerating voltage) are selected to cause the functional groups and additives in the photoresist material of layer 30 which interact with electron beam 52 to undergo a chemical change, i.e., cross-linking and decomposition. Shell 58, top cured region 54, and cured region 62 are representative of cross-linked and decomposed regions of layer 30. The portions of layer 30 that electron beam 52 are unable to penetrate or bombarded, e.g., uncured regions 60, 56, remain unaffected. (i.e., the functional groups and additives in those regions are not cross-linked to the point of complete decomposition).

By varying the electron beam flood exposure conditions, processing gas, and/or wafer temperature, the penetration depth of electron beam 52 into layer 30 and/or the degree of chemical change to layer 30 can be controlled. Hence, the curing depth (i.e., the shape and dimensions of the cross-linked or cured region(s) in feature 50) and related etching properties of features patterned on layer 30 can be controlled to achieve much smaller critical dimensions (CDs) than would otherwise be possible.

The degree of decomposition that the functional groups of the polymer material comprising layer 30 will undergo is a function of the dose of electron beam 52. The penetration depth of electron beam 52 into layer 30 is a function of the energy of electron beam 52 The penetration depth determines the depth or thickness of shell 58, top cured region 54, and cured region 62. In one embodiment, the penetration depth can be selected as a function of the accelerating voltage of electron beam 52 and this relationship can be approximately expressed as:

$$R_g = \frac{0.046 V_a^{1.75}}{d}$$

where $R_g$ is the penetration depth in microns, $V_a$ is the accelerating voltage or energy in keV, and d is the density of the target material (e.g., layer 16) in g/cm³.

Cross-linking at least a portion of feature 50 increases the bulk modulus and the bulk toughness of feature 50, as well as increasing the interfacial toughness of the substrate-resist polymer bond (i.e., the bond between feature 50 and layer 28). This ensures that feature 50 will be better able to withstand or prevent pattern bending, pattern collapse, pattern breakage, and/or general mechanical deformation during etch processing, such as resist trimming step 46. In addition, the cross-linked region of feature 50 will have a reduced etch rate relative to the noncross-linked region, such that feature 50 can be trimmed to a much smaller CD and higher aspect ratios (in step 46) than would otherwise be possible.

Furthermore, each of shell 58, top cured region 54, and cured region 62 has different electrical, optical, and material properties relative to uncured regions 60, 56. Complete decomposition of the functional groups of the polymer material causes the electrical and optical properties of shell 58 and regions 54, 62 to be different, increases the density of shell 58 and regions 54, 62, and decreases the porosity of shell 58 and regions 54, 62 relative to uncured regions 60, 56. The cured regions have greater etch resistance (or, equivalently, a slower erosion or etch rate) than the uncured regions. Hence, in resist trimming step 46 following the electron beam exposure or curing step 44, a greater amount of lateral trimming of features on layer 30 (e.g., feature 50) can occur without adversely thinning layer 30 in subsequent etch processing. Alternatively, layer 30 may be thinner and maintain the current resist trimming process.

In FIG. 5, a cross-sectional view of a portion of wafer 24 during resist trimming step 46 is shown. Resist trimming step 46 is preferably a plasma etching step. Wafer 24 is exposed to a plasma etchant 63 to trim or reduce the dimensions of features patterned on layer 30. Plasma etchant 63 can comprise a variety of plasma etch chemistries, such as, $O_2$, $HBr/O_2$, $Cl_2/O_2$, $N_2/He/O_2$, or $N_2/O_2$. In one embodiment, wafer 24 is in a different processing environment (e.g., different chamber) than for electron beam curing step 44. A variety of standard etching systems, such as those manufactured by Applied Materials of Santa Clara, Calif., or Lam Research of Fremont, Calif., may be utilized to provide plasma etchant 63.

Plasma etchant 63 etches all exposed surfaces on layer 30, including the top and side surfaces. However, because different portions of layer 30 have different etch rates following electron beam curing step 44 (e.g., top cured region 54 vs. uncured region 56), the dimensional reduction of all of the surfaces of layer 30 will not be the same. As shown in FIG. 5, the vertical reduction of feature 50 (shown upon completion of step 46 as a trimmed feature 64) is less than the lateral reduction of feature 50. The slower etch rate of shell 58 and region 54 relative to region 60 and region 56, respectively, causes advantageous non-uniform trimming of feature 50. Trimmed feature 64 has a lateral dimension or CD 66. When all of feature 50 has been cured (e.g., cured region 62 in FIG. 4C), then feature 50 trims at the same rate in the vertical and horizontal directions. Nevertheless, since the mechanical strength and etch stability of feature 50 has been much improved via step 44, prolonged trimming may still occur to achieve desired the CD. The remaining thickness of layer 30 will exhibit sufficient stability to maintain pattern integrity in subsequent etch processings.

Figure 6:
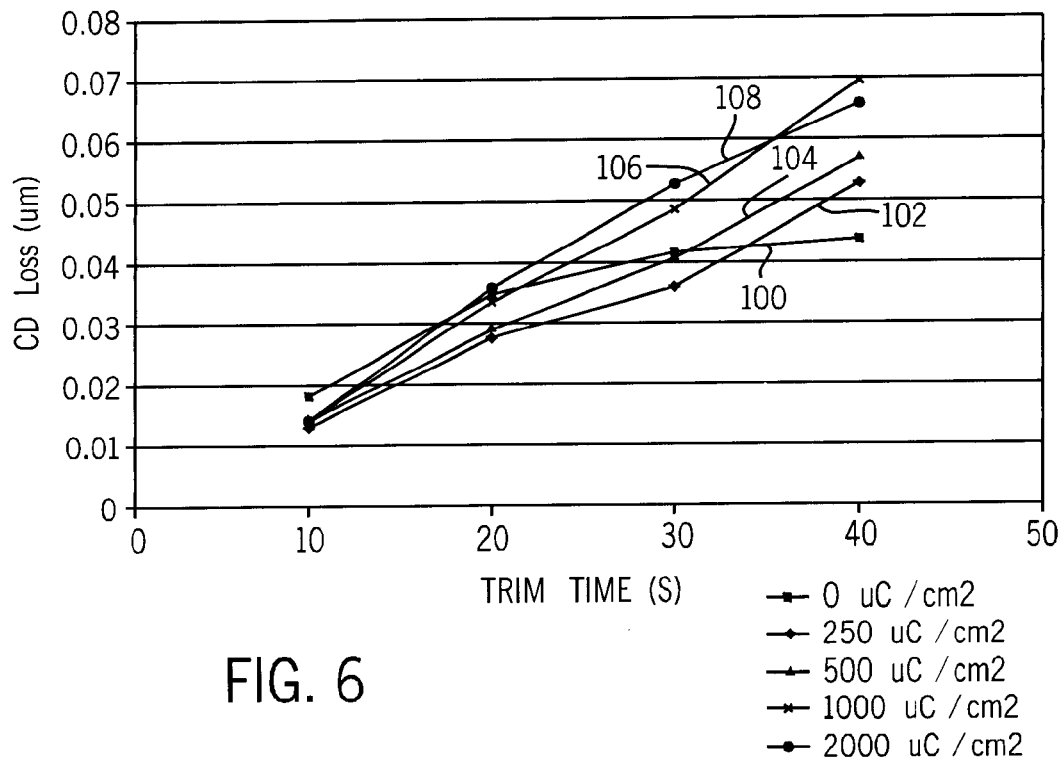
FIG. 6 is a plot showing critical dimension reduction vs. trim time for various electron beam doses.

In any case, without step 44, trimmed feature 64 would exhibit pattern deformation during step 46, would have a trimmed CD greater than dimension 66, and/or would not be able to maintain pattern integrity in subsequent processings (such as, an etch process to transfer the pattern to layer 28). In FIG. 6, a plot of CD loss or reduction vs. the trim time (i.e., the length of time that wafer 24 is undergoing trimming step 46) for various doses of an electron beam is shown. The photoresist line feature has a nominal lateral dimension of 130 nm; the substrate is a 27 nm thickness of silicon oxynitride (SiON) on 150 nm thickness of polysilicon; and the photoresist material is a PAR700 photoresist. Plot lines 100, 102, 104, 106, 108 show the CD loss as a function of the trim time for the photoresist line feature cured with an electron beam dose of 0 $\mu C/cm^2$, 250 $\mu C/cm^2$, 500 $\mu C/cm^2$, 1000 $\mu C/cm^2$, and 2000 $\mu C/cm^2$, respectively. For plot line 100 (i.e., the uncured feature), the inflection point at the 20 second trim time represents trim etch-induced disintegration and possible pattern collapse. In other words, without electron beam curing, pattern collapse and pattern degradation of the feature being trimmed occurs after 20 seconds of trimming and at a lateral or critical dimension of roughly 95 nm. In contrast, even mild electron beam curing prevents pattern deformation and enhances CD loss (see plot lines 102–108). As the electron beam dose increases, the CD reduction at a given trim time also increases. This increase in CD reduction saturates at an electron beam dose greater than approximately 2000 $\mu C/cm^2$ (not shown).

Figure 7:
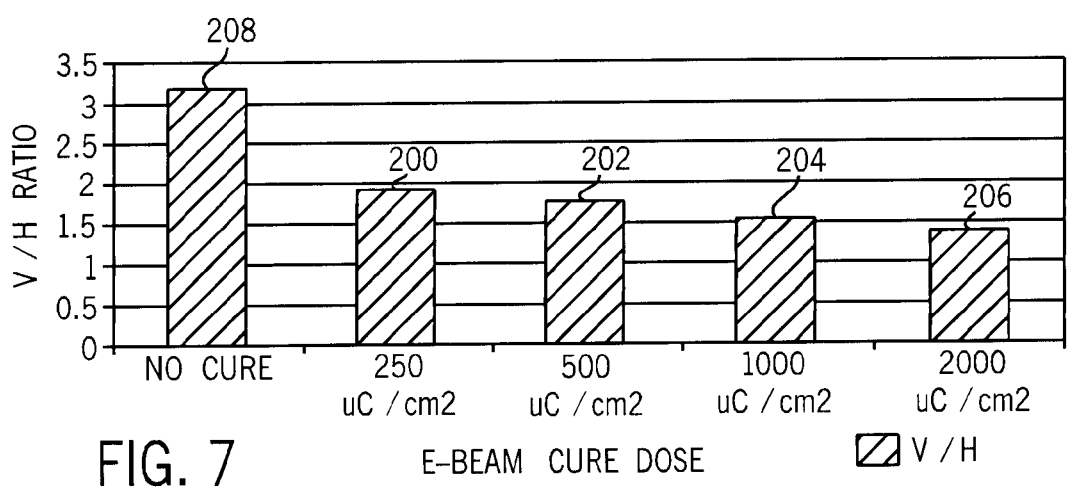
FIG. 7 is a plot showing vertical-to-horizontal etch rate ratios vs. electron beam doses.

In FIG. 7, a plot of the vertical-to-horizontal etch rate ratio (V/H ratio) as a function of the electron beam dose is shown. A 130 nm nominal laterally dimensioned line feature is used, lithographically patterned on the PAR700 photoresist, as described with respect to FIG. 6. A lower V/H ratio is indicative of an improved trimming process. As shown in FIG. 7, each of V/H ratios 200, 202, 204, 206 is lower than an V/H ratio 208 for the non-cured line feature. For example, each of V/H ratios 204, 206 is less than or equal to 1.5, which is comparable to a production grade polygate 248 nm photoresist material (KrF).

Figure 8:
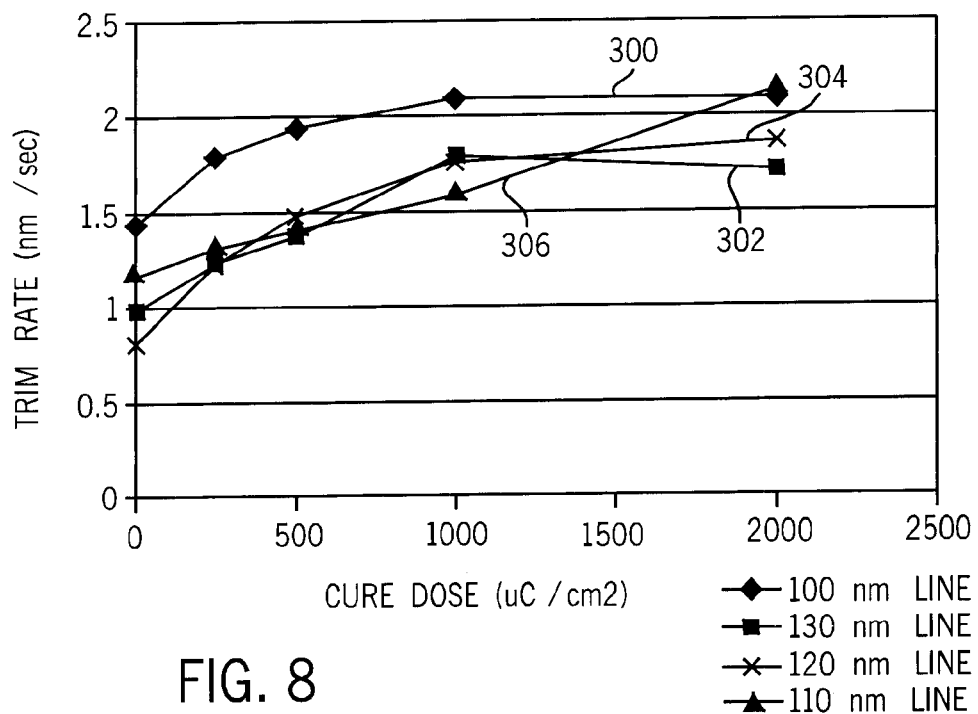
FIG. 8 is a plot showing trim rate vs. electron beam dose for various nominally dimensioned line features.
Figure 9:
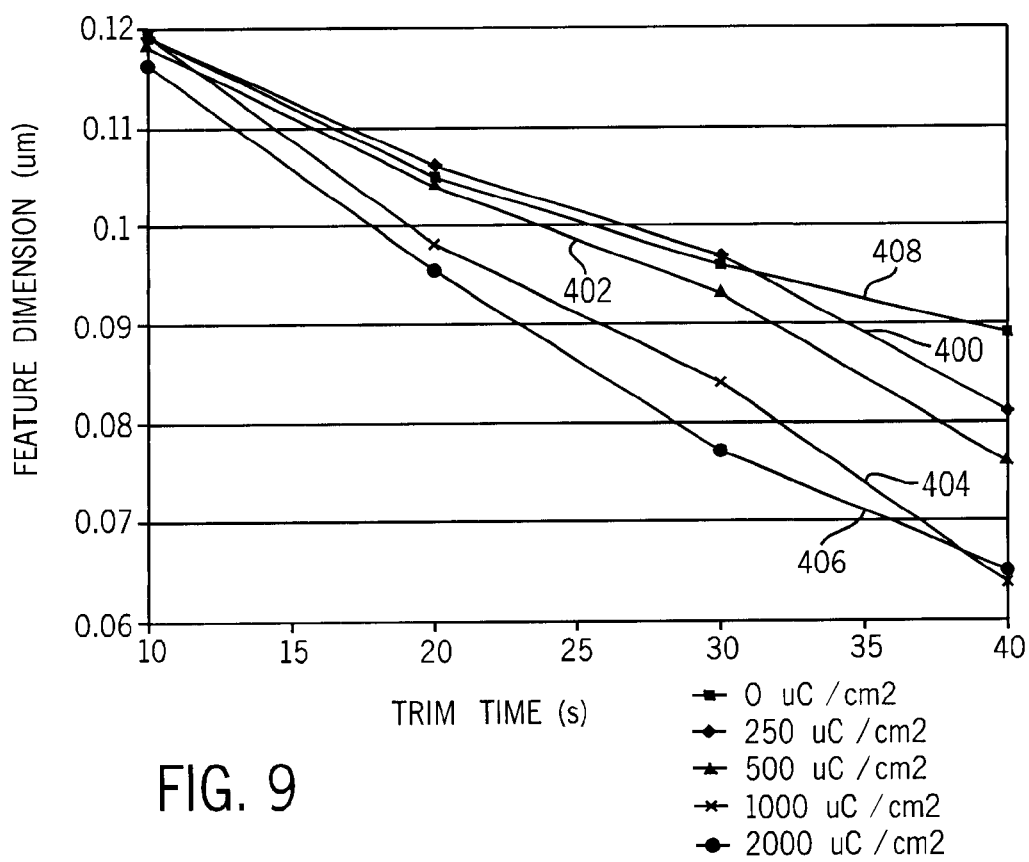
FIG. 9 is a plot showing feature dimension vs. trim time for various electron beam doses.

In FIG. 8, a plot of the etch trim rate vs. the electron beam dose for 100 nm, 110 nm, 120 nm, and 130 nm wide line features which are lithographically patterned on PAR700 photoresist is shown. For each of plot lines 300, 302, 304, 306, the trim rate increases as the electron beam dose increases. In FIG. 9, a plot of the feature dimension or CD vs. the trim time for various electron beam doses is shown. Starting with a 130 nm nominally dimensioned line feature (as described with respect to FIG. 6), plot lines 400, 402, 404, 406 show that smaller CDs can be achieved by electron beam curing the line feature prior to the trimming process than with no curing of the line feature (a plot line 408). The inflection point at 30 seconds for plot line 408 also indicates that prolonged trimming causes adverse pattern degradation for the uncured line feature.

Hence, using a 193 nm photoresist material for layer 30, lateral dimension 51 (FIG. 3) of feature 50 can be approximately 130 nm before step 46 and lateral dimension 66 (FIG. 5) achievable with electron beam curing or exposure step 44 is in the sub-60 nm range. Moreover, lateral dimension 66 of 35–50 nm is also achievable in a tight pitch. In contrast, without electron beam curing, feature 50 would not be able to achieve a lateral dimension smaller than approximately 90 nm without experiencing pattern deformation and/or etch instability in subsequent processes.

The advantageous process also allows the initial or original thickness of layer 30 to be thinner while maintaining the existing resist trimming process. This initially thinner thickness of layer 30 allows lithographic printing of smaller lateral dimensions. Thus, after the resist trimming process, the resulting trimmed feature can have much smaller lateral dimensions than is otherwise possible.

It is understood that although the detailed drawings, specific examples, and particular values describe the exemplary embodiments of the present invention, they are for purposes of illustration only. The exemplary embodiments of the present invention are not limited to the precise details and descriptions described herein. For example, although particular materials or chemistries are described, other materials or chemistries can be utilized. Various modifications may be made in the details disclosed without departing from the spirit of the invention as defined in the following claims

What is claimed is:

1. A method for achieving a sub-lithographic critical dimension in an integrated circuit device feature, the integrated circuit device feature formed on a semiconductor wafer using a feature patterned on a photoresist layer, the method comprising the steps of:

curing the feature patterned on the photoresist layer with an electron beam; and trimming the cured feature to form a trimmed feature, wherein the sub-lithographic critical dimension of the trimmed feature is dependent on a dose of the electron beam, wherein the cured feature includes at least one of a cured shell region and a cured top region, wherein the sub-lithographic dimension of the trimmed feature is at least approximately 60% less than a nominal lateral dimension of the feature patterned on the photoresist layer.

2. A method for achieving a sub-lithographic critical demension in an integrated circuit device feature, the integrated circuit device feature formed on a semiconductor wafer using a feature patterned on a photoresist layer, the method comprising the steps of:

curing the feature patterned on the photoresist layer with an electron beam; and trimming the cured feature to farm a trimmed feature, wherein the sub-lithographic critical dimension of the trimmed feature is dependent on a dose of the electron beam, wherein the sub-lithographic dimension of the trimmed feature is at least approximately 60% less than a nominal lateral dimension of the feature patterned on the photoresist layer.

3. The method of claim 1, wherein the curing step includes at least one of decarboxlyating, cross-linking, and densifying the feature patterned on the photoresist layer.

4. The method of claim 3, wherein each of the cured shell region and the cured top region is cross-linked.

5. The method of claim 1, wherein a material comprising the photoresist layer is at least one of an acrylate-based polymer, an alicyclic-based polymer, and an acrylate and alicyclic hybrid-based polymer.

6. The method of claim 1, wherein the electron beam dose is less than 2000 $\mu C/cm^2$.

7. A process for patterning a feature an a photoresist layer having enhanced etch stability and trimmability in an etch process, the feature including a top region, the process comprising: forming a feature associated with the photoresist layer; irradiating the feature patterned on the photoresist layer with an electron beam, wherein at least the top region of the feature is cross-linked to the point of complete decomposition to form a cross-linked top region; and trimming the irradiated feature wherein the sub-lithographic dimension of the trimmed feature is at least approximately 60% less than a nominal lateral dimension of the feature formed on the photoresist layer.

8. The process of claim 7, wherein a vertical thickness of the cross-linked top region is determined by a penetration depth of the electron beam into the feature.

9. The process of claim 8, wherein the penetration depth of the electron beam is a function of an energy of the electron beam.

10. The process of claim 7, wherein the etch process is at least one of a resist trimming process and an underlayer etching process.

11. The process of claim 7, wherein the cross-linked top region increases a bulk modulus of the feature.

12. The process of claim 7, wherein the cross-linked top region increases a bulk toughness of the feature.

13. The process of claim 7, wherein the cross-linked top region increases an interfacial toughness of a substrate-resist polymer bond associated with the feature.

14. An integrated circuit fabrication process, the process comprising:

curing a patterned photoresist layer with an electron beam, the patterned photoresist layer disposed over a substrate and including a feature;

trimming the cured photoresist layer with a plasma etch, the cured photoresist layer including a trimmed feature; and transferring a pattern of the trimmed photoresist layer to the substrate, wherein a critical dimension of the transferred pattern on the substrate has a sub-lithographic dimension and is a function of a dose of the electron beam in the curing step, wherein the sub-lithographic dimension of the trimmed feature is at least approximately 60% less than a nominal lateral dimension of the feature patterned on the photoresist layer.

15. The process of claim 14, wherein the critical dimension decreases as the dose of the electron beam increases.

16. The process of claim 14, wherein the dose of the electron beam is in the range of 0.1 to approximately 2000 $\mu C/cm^2$.

17. The process of claim 14, wherein the curing step includes cross-linking at least a portion of the patterned photoresist layer.

18. The process of claim 17, wherein the at least a portion of the patterned photoresist layer that has been cross-linked permits a trimming time of the trimming step to be greater than 20 seconds without the cured photoresist layer becoming deformed.

19. The process of claim 14, wherein the patterned photoresist layer is comprised of an acrylate-based polymer, an alicyclic-based polymer, or an acrylate and alicyclic hybrid-based polymer.

20. The process of claim 14, wherein, the critical dimension is in a sub-50 nm range.

* * * * *

UNITED STATES PATENT AND TRADEMARK OFFICE
CERTIFICATE OF CORRECTION

PATENT NO. : 6,653,231 B2
DATED : November 25, 2003
INVENTOR(S) : Uzodinma Okoroanyanwu, Chih-Yuh Yang and Jeffrey A. Shields It is certified that error appears in the above-identified patent and that said Letters Patent is hereby corrected as shown below:

Column 8,
Line 50, replace the word "demension" with the word -- dimension --.
Line 56, replace the word "farm" with the word -- form --.

Column 9,
Line 7, replace the word "an" with the word -- on --.

Signed and Sealed this

Twenty-ninth Day of June, 2004

JON W. DUDAS
*Acting Director of the United States Patent and Trademark Office*